(12) United States Patent
Itonaga et al.

(10) Patent No.: US 8,350,305 B2
(45) Date of Patent: Jan. 8, 2013

(54) SOLID-STATE IMAGING DEVICE AND CAMERA

(75) Inventors: Kazuichiro Itonaga, Tokyo (JP); Yu Oya, Kanagawa (JP)

(73) Assignee: Sony Corporation, Tokyo (JP)

( * ) Notice: Subject to any disclaimer, the term of this patent is extended or adjusted under 35 U.S.C. 154(b) by 563 days.

(21) Appl. No.: 12/003,981

(22) Filed: Jan. 4, 2008

(65) Prior Publication Data

US 2008/0197387 A1 Aug. 21, 2008

(30) Foreign Application Priority Data

Feb. 16, 2007 (JP) ................. 2007-036620

(51) Int. Cl.
*H01L 31/062* (2006.01)
(52) U.S. Cl. ......... 257/292; 257/E27.133; 257/E31.097; 257/E27.12; 438/7
(58) Field of Classification Search .................. 257/292, 257/E27.13, E31.097; 438/7
See application file for complete search history.

(56) References Cited

U.S. PATENT DOCUMENTS

| | | | |
|---|---|---|---|
| 6,287,908 B1* | 9/2001 | Brand | 438/221 |
| 2004/0251481 A1* | 12/2004 | Rhodes | 257/292 |
| 2005/0062084 A1* | 3/2005 | Han | 257/292 |
| 2005/0139878 A1* | 6/2005 | Han et al. | 257/292 |
| 2007/0007559 A1* | 1/2007 | Lee et al. | 257/239 |
| 2008/0035957 A1* | 2/2008 | Park et al. | 257/204 |

FOREIGN PATENT DOCUMENTS

| | | |
|---|---|---|
| JP | 2002-270808 | 9/2002 |
| JP | 2006-019752 | 1/2006 |
| JP | 2007-243197 | 9/2007 |
| JP | 2007-335673 | 12/2007 |

OTHER PUBLICATIONS

Japanese Office Action issued Apr. 7, 2009 for corresponding Japanese Application No. 2007-036620.

* cited by examiner

*Primary Examiner* — Thao Le
*Assistant Examiner* — Matthew Gordon
(74) *Attorney, Agent, or Firm* — Rader Fishman & Grauer, PLLC

(57) ABSTRACT

A solid-state imaging device is provided. The solid-state imaging device includes: pixels arrayed; a photoelectric conversion element in each of the pixels; a read transistor for reading electric charges photoelectrically-converted in the photoelectric conversion elements to a floating diffusion portion; a shallow trench element isolation region bordering the floating diffusion portion; and an impurity diffusion isolation region for element isolation regions other than the shallow trench element isolation region.

19 Claims, 12 Drawing Sheets

SOLID-STATE IMAGING DEVICE AND CAMERA

CROSS REFERENCES TO RELATED APPLICATIONS

The present invention contains subject matter related to Japanese Patent Application JP 2007-036620 filed in the Japanese Patent Office on Feb. 16, 2007, the entire contents of which are incorporated herein by reference.

BACKGROUND OF THE INVENTION

1. Field of the Invention

The present invention relates to a solid-state imaging device and a camera, and particularly relates to a MOS (metal-oxide semiconductor) solid-state imaging device and camera.

2. Description of the Related Art

Solid-state imaging devices include a charge-transfer solid-state imaging device represented by a CCD (charge-coupled device) image sensor and an amplification solid-state imaging device represented by a MOS (metal-oxide semiconductor) image sensor such as a CMOS (complementary metal-oxide semiconductor) image sensor. When comparing the CCD image sensor with the MOS image sensor, the CCD image sensor may need a high driving voltage to transfer signal electric charges, so that a power supply voltage for the CCD image sensor may be higher than that of the MOS image sensor.

Accordingly, a mobile phone unit incorporating a camera, a PDA (personal digital assistant) and other mobile devices typically use a CMOS image sensor as a solid-state imaging device mounted thereon. The CMOS image sensor is advantageous in that a power supply voltage is lower than that of the CCD image sensor and power consumption is lower than that of the CCD image sensor.

For insulating and isolating elements, a LOCOS (local oxidation of silicon) (selective oxidation) element isolation system or a STI (shallow trench isolation) element isolation system is known as an element isolation system used in the MOS image sensor (see Japanese Unexamined Patent Application Publication No. 2002-270808). In particular, the STI element isolation system has been widely used with pixels increasingly miniaturized.

In a solid-state imaging device, the number of pixels has been increased along with the resolution being improved, and a pixel is further miniaturized because the solid-state imaging device includes a large number of pixels.

SUMMARY OF THE INVENTION

Since the pixel is increasingly miniaturized as the number thereof is increased in the MOS image sensor as described above, the area of a photodiode serving as a photoelectric conversion portion is reduced, with the result that a saturated electric charge amount and the sensitivity are reduced. Specifically, the number of electric charges photoelectrically-converted per pixel, that is, the number of electrons per pixel, is reduced and the saturated electric charge amount (accordingly, saturated signal amount) decreases. This tendency increases as the pixel is further miniaturized.

When insulation and isolation based on the LOCOS isolation system or STI isolation system is used as element isolation, a dark current and a white spot may be caused on an interface between the photodiode serving as the photoelectric conversion element and the insulated and isolated area.

It is desirable to provide a solid-state imaging device and a camera in which the sensitivity is increased by improving the conversion efficiency when converting electric charges into a signal voltage, while suppressing the occurrence of a dark current and a white spot.

According to an embodiment of the present invention, there is provided a solid-state imaging device having arrayed pixels that each include a photoelectric conversion element and a read transistor for reading electric charges photoelectrically-converted in the photoelectric conversion element to a floating diffusion portion. An element isolation region bordering the floating diffusion portion is formed of a shallow trench element isolation region, and other element isolation regions are formed of an impurity diffusion isolation region.

According to an embodiment of the solid-state imaging device and the camera of the present invention, since the element isolation region bordering the floating diffusion portion is formed of the shallow trench element isolation region, the capacity of the floating diffusion portion is reduced, so that the conversion efficiency is increased. Since other element isolation regions are formed of the impurity diffusion isolation region, the occurrence of a dark current and a white spot can be suppressed.

According to the embodiment of the solid state imaging device and the camera of the present invention, it is possible to increase the sensitivity by improving the conversion efficiency while suppressing a dark current and a white spot. Accordingly, the solid-state imaging device and the camera of the embodiment are suitable for application to the solid-state imaging device and the camera in which the area of a pixel is reduced as the number of pixels is increased.

DESCRIPTION OF THE PREFERRED EMBODIMENTS

Conversion efficiency of the photoelectric conversion when converting electric charges into a signal voltage has been studied. Specifically, photoelectrically-converted electric charges are converted into a voltage and outputted as a pixel signal from a circuit of the MOS image sensor. Hence, even when the number of electrons (the amount of electric charges) per pixel is small, a decrease in the number caused by the reduction in the area of the photodiode can be compensated for if the conversion efficiency that expresses a signal voltage per electric charge is increased.

Conversion efficiency η is defined by the following equation (1). A unit is μV/e.

$$\eta = \frac{q}{C_{FD}} G [\mu V/e] \quad \text{[Equation 1]}$$

q: amount of electric charge per electron
$C_{FD}$: total capacity relating to a floating diffusion portion
G: gain of source follower The conversion efficiency η is proportional to the reciprocal number of the total capacity relating to the floating diffusion portion and proportional to the gain G of the source follower. Accordingly, the conversion efficiency η increases by increasing the gain and decreasing the total capacity of the floating diffusion portion. The total capacity of the floating diffusion portion indicates all of the junction capacitance of a diffusion layer, which becomes the floating diffusion portion, the gate overlap capacity, the wiring capacity of a wire connected to the floating diffusion portion and other capacity relating to the floating diffusion portion. Here, since the gain of the source follower is 1.0 at the maximum and typically about 0.8, it is important to reduce the total capacity $C_{FD}$ of the floating diffusion portion for improving the conversion efficiency η.

According to embodiments of a solid-state imaging device and a camera of the present invention, the total capacity relating to a floating diffusion portion is reduced to improve the conversion efficiency, and therefore a dark current and a white spot can be suppressed.

The embodiments of the present invention will be described below in detail with reference to the drawings.

Figure 1:
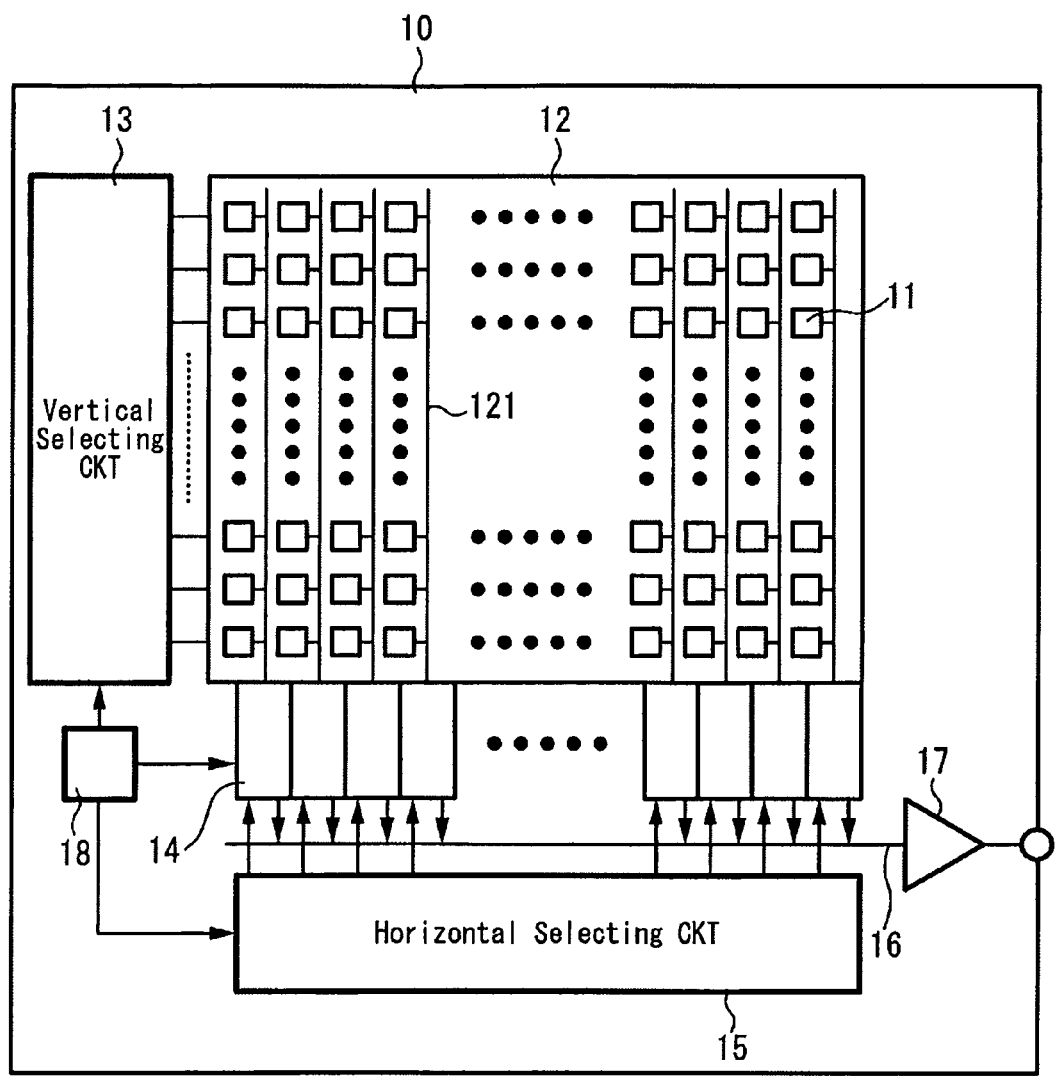
FIG. 1 is a block diagram showing an example of an arrangement of a MOS image sensor to which an embodiment of the present invention is applied.

FIG. 1 is a block diagram showing an example of a configuration of an amplification solid-state imaging device, such as a MOS (metal-oxide semiconductor) image sensor, to which an embodiment of the present invention is applied. As shown in FIG. 1, a MOS image sensor 10 according to the embodiment has an area sensor configuration. The MOS image sensor 10 includes a unit pixel 11 including a photoelectric conversion element, for example, a photodiode, a pixel array portion 12 including the unit pixels 11 arrayed in a two-dimensional matrix, a vertical selecting circuit 13, a column circuit 14 serving as a signal processing circuit, a horizontal selecting circuit 15, a horizontal signal line 16, an output circuit 17, a timing generator 18 and others.

Vertical signal lines 121 are wired in the pixel array portion 12 for each column of the pixels arranged in a matrix. A specific circuit arrangement of the unit pixel 11 will be described later. The vertical selecting circuit 13 includes a shift register and so on. The vertical selecting circuit 13 outputs control signals, such as a transfer signal, to drive a read transistor (hereinafter referred to as a "transfer transistor", and a read gate electrode is referred to as a "transfer gate electrode") 112 and a reset signal to drive a reset transistor 113 for respective rows sequentially. As a result, the respective unit pixels 11 in the pixel array portion 12 are selectively driven for respective rows.

The column circuit 14 is a signal processing circuit provided for the pixels in the horizontal direction of the pixel array portion 12, that is, for respective vertical signal lines 121, and includes a S/H (sample and hold) circuit and a CDS (correlated double sampling) circuit and the like. The horizontal selecting circuit 15 includes a shift register and so on. The horizontal selecting circuit 15 sequentially selects signals outputted from the respective pixels 11 through the column circuit 14 and outputs the results to the horizontal signal line 16. Here, horizontal selecting switches are not illustrated in FIG. 1 in order to simplify the description. The horizontal selecting switches are sequentially turned ON/OFF for respective columns by the horizontal selecting circuit 15.

When the horizontal selecting circuit 15 selectively drives the horizontal selecting switches, signals of the unit pixels 11 sequentially outputted from the column circuit 14 for respective columns are supplied through the horizontal signal line 16 to the output circuit 17, amplified and processed at the output circuit 17 and outputted to the outside of a device. The timing generator 18 generates various timing signals, and drives and controls the vertical selecting circuit 13, the column circuit 14 and the horizontal selecting circuit 15 based on such signals.

Figure 2:
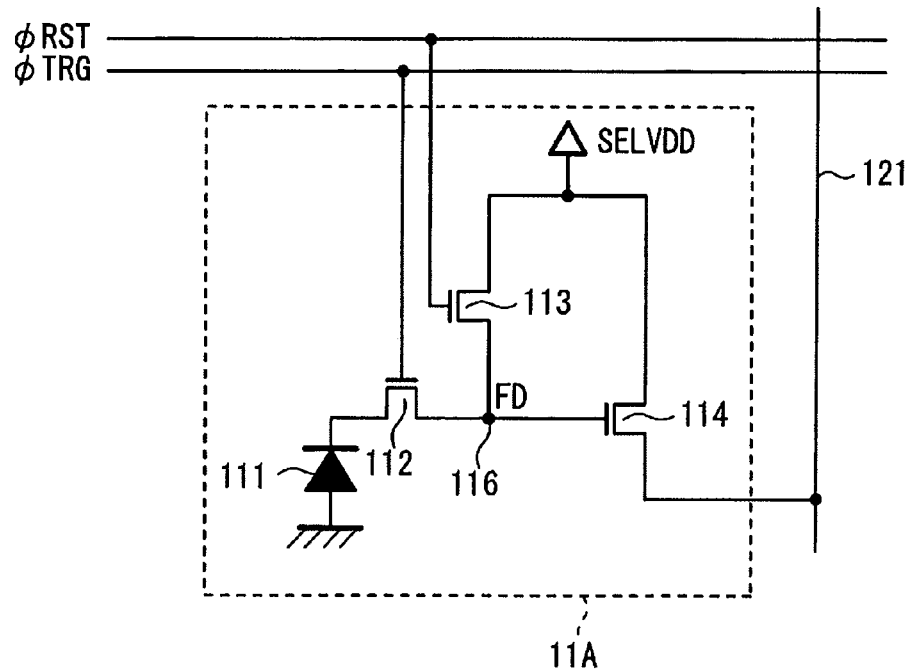
FIG. 2 is a circuit diagram showing an example of a circuit arrangement of a unit pixel.

FIG. 2 is a circuit diagram showing an example of a circuit arrangement of the unit pixel 11. As shown in FIG. 2, a unit pixel 11A according to the example includes three pixel transistors of the transfer transistor 112, the reset transistor 113 and an amplification transistor 114, in addition to the photoelectric conversion element, for example, a photodiode 111. Here, N-channel MOS transistors, for example, are used as these pixel transistors 112, 113 and 114.

The transfer transistor 112 is connected between the cathode of the photodiode 111 and the FD (floating diffusion) portion 116 and transfers signal electric charges (herein, electrons) photoelectrically-converted in the photodiode 111 and accumulated therein to the FD portion 116 upon receiving a transfer pulse φTRG supplied to the gate thereof.

The drain of the reset transistor 113 is connected to a selection power supply SELVDD and the source thereof is connected to the FD portion 116. Thus, when a reset pulse φRST is supplied to the gate of the reset transistor 113 before signal electric charges are transferred from the photodiode 111 to the FD portion 116, the reset transistor 113 resets the electric potential of the FD portion 116. The selection power supply SELVDD selectively uses a VDD level and a GND level as a power supply voltage.

The amplification transistor 114 has a source follower arrangement in which the gate thereof is connected to the FD portion 116, the drain thereof is connected to the selection power supply SELVDD and the source thereof is connected to the vertical signal line 121. When the selection power supply SELVDD has a VDD level, the amplification transistor 114 is energized to select the pixel 11A and outputs electric potential obtained from the FD portion 116 reset by the reset transistor 113 to the vertical signal line 121 as a reset level. Further, the amplification transistor 114 outputs potential obtained from the FD portion 116 after signal electric charges are transferred as a signal level to the vertical signal line 121 by the transfer transistor 112.

Figure 3:
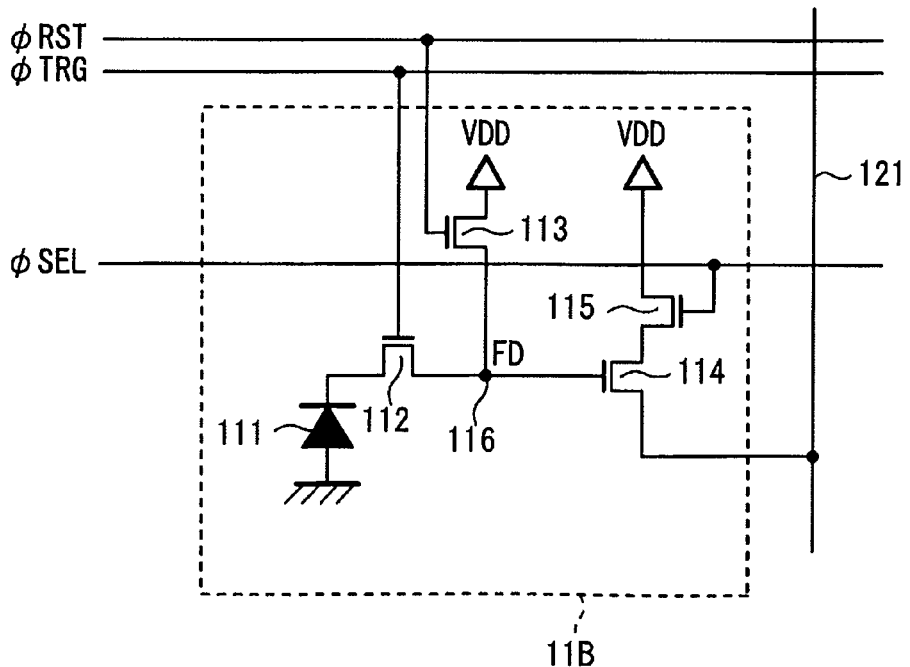
FIG. 3 is a circuit diagram showing another example of a circuit arrangement of a unit pixel.

FIG. 3 is a circuit diagram showing another example of a circuit arrangement of the unit pixel 11. As shown in FIG. 3, a unit pixel 11B according to the circuit example is a pixel circuit which includes, in addition to the photoelectric conversion element, for example, the photodiode 111, four pixel transistors of the transfer transistor 112, the reset transistor 113, the amplification transistor 114 and the selection transistor 115. Herein, N-channel MOS transistors, for example, are used as these pixel transistors 112 to 115.

The transfer transistor 112 is connected between the cathode of the photodiode 111 and the FD (floating diffusion) portion 116 and transfers signal electric charges (herein, electrons) photoelectrically-converted in the photodiode 111 and accumulated herein to the FD portion 116 in response to the transfer pulse φTRG supplied to the gate thereof.

The reset transistor 113 is connected at the drain thereof to the power supply VDD and connected at the source thereof to the FD portion 116 and resets electric potential of the FD portion 116 when the reset pulse φRST is supplied to the gate thereof before signal electric charges are transferred from the photodiode 111 to the FD portion 116.

The selection transistor 115 is connected at the drain thereof to the power supply VDD, connected at the source thereof to the drain of the amplification transistor 114 and turned ON in response to the selection pulse φSEL supplied to the gate thereof to select the pixel 11B by supplying the power supply VDD to the amplification transistor 114. It should be noted that the selection transistor 115 may be connected between the source of the amplification transistor 114 and the vertical signal line 121.

The amplification transistor 114 has a source follower arrangement in which the gate thereof is connected to the FD portion 116, the drain thereof is connected to the source of the selection transistor 115 and the source thereof is connected to the vertical signal line 121, respectively. The amplification transistor 114 outputs electric potential of the FD portion 116 after reset by the reset transistor 113 to the vertical signal line 121 as a reset level. Further, the amplification transistor 114 outputs electric potential of the FD portion 116 after signal electric charges are transferred by the transfer transistor 112 to the vertical signal line 121 as a signal level.

Next, an embodiment of a pixel array portion according to the present invention, which is applied to the above-mentioned pixel array portion 12, will be described.

FIG. 4 to FIGS. 7A, 7B and 7C show a solid-state imaging device, in this embodiment, a CMOS image sensor according to a first embodiment of the present invention, and in particular, a first embodiment of a pixel array portion thereof.

Figure 4:
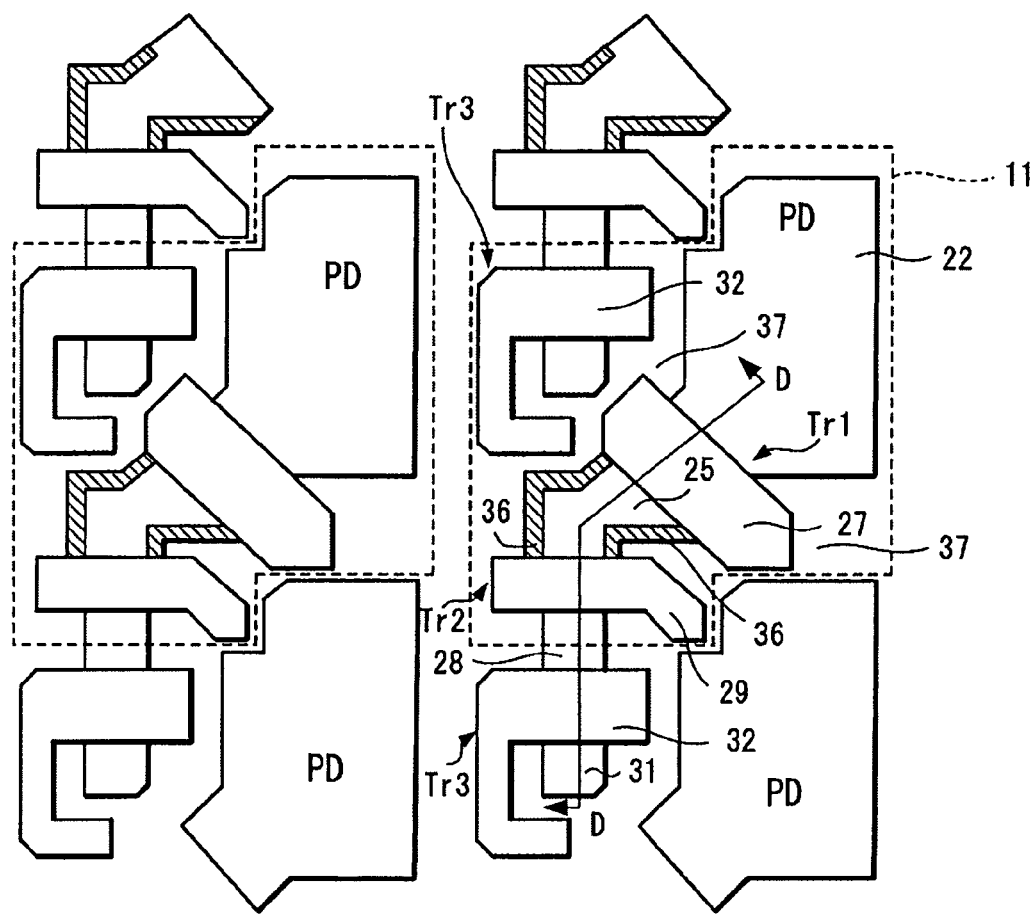
FIG. 4 is a diagram showing a solid-state imaging device according to a first embodiment of the present invention, in particular, showing main portions of a pixel array portion thereof.

FIG. 4 shows an example of a layout of a pixel array portion 12 according to the embodiment of the present invention. In this embodiment, as shown in FIG. 4, the pixel array portion includes an array of a plurality of unit pixels 11 formed of a photodiode 22 serving as a photoelectric conversion element and three pixel transistors, that is, a transfer transistor Tr1, a reset transistor Tr2 and an amplification transistor Tr3. In this example, each of the transistors Tr1 to Tr3 is formed of a n-channel MOS transistor.

Figure 5:
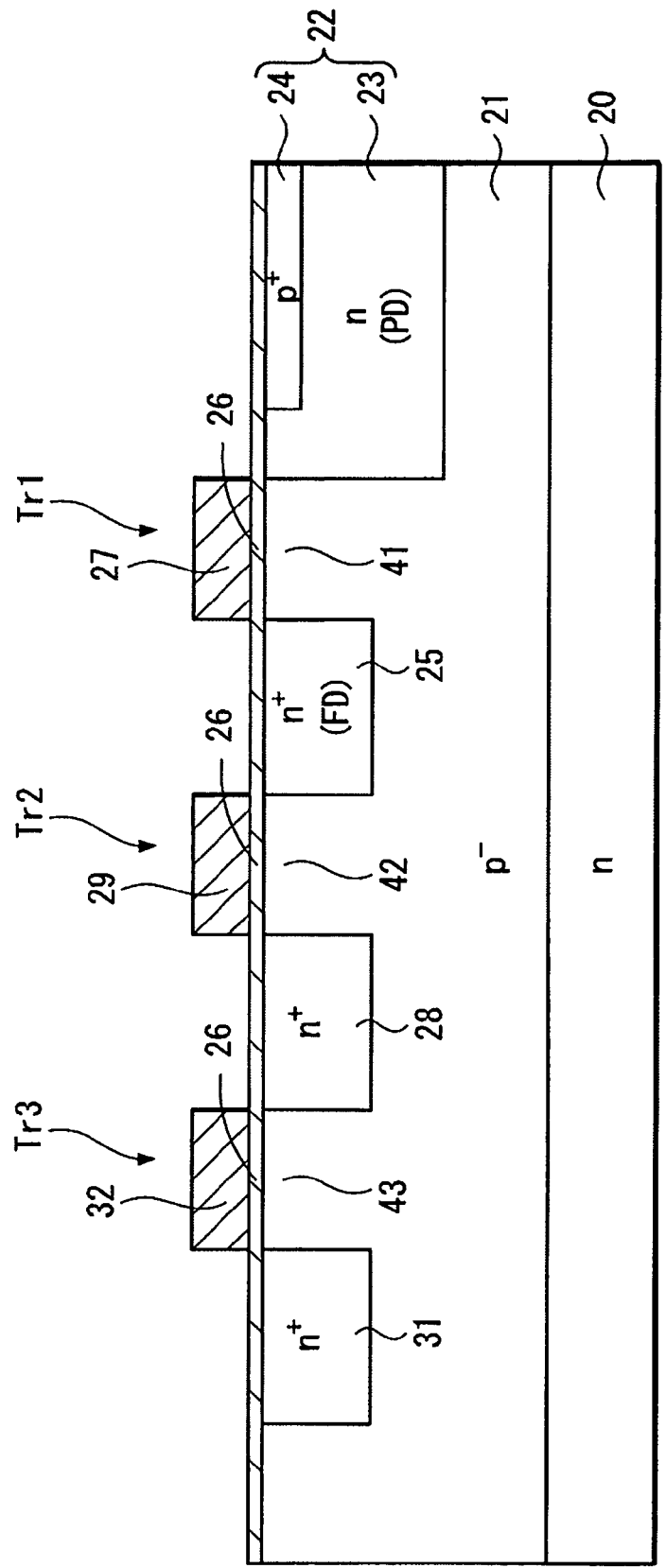
FIG. 5 is a cross-sectional view on the line D-D shown in FIG. 4.

As shown in FIGS. 4 and 5 (FIG. 5 is a cross-sectional view on the line D-D in FIG. 4), a first conductivity-type semiconductor substrate, in this example, a n-type silicon substrate 20, is provided with a second conductivity-type, for example, a p-type semiconductor well region 21 formed thereon. The photodiode 22 is formed in the p-type semiconductor well region 21 and includes a n-type semiconductor region (diffusion layer) 23 which becomes a charge accumulation region and a p-type accumulation layer 24 to suppress a dark current on the surface of the n-type semiconductor region (diffusion layer) 23.

The transfer transistor Tr1 includes the photodiode 22 as the source thereof, the n-type semiconductor region (diffusion layer) 25, which becomes the floating diffusion (FD) portion formed in the p-type semiconductor well region 21, as the drain thereof and the transfer gate electrode 27 formed through a gate-insulated film 26.

The reset transistor Tr2 includes the n-type semiconductor region 25, which becomes the floating diffusion (FD) portion as the source thereof, a n-type semiconductor region (diffusion layer) 28 formed in the p-type semiconductor well region 21 as the drain thereof and a reset gate electrode 29 formed through the gate-insulated film 26.

The amplification transistor Tr3 includes n-type semiconductor regions (diffusion layers) 31 and 28 formed in the p-type semiconductor well region 21 as the source and drain thereof and an amplification gate electrode 32 formed through the gate-insulated film 26.

Figure 6:
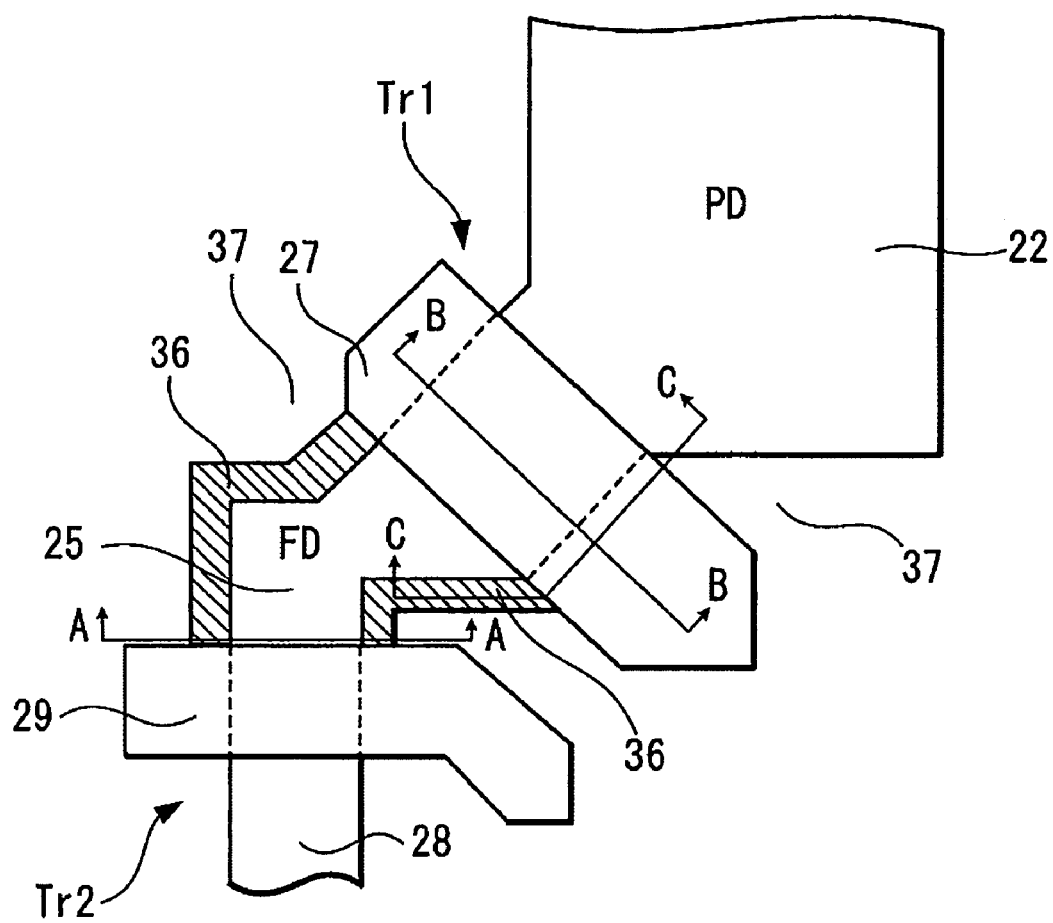
FIG. 6 is a diagram showing main portions of the unit pixel shown in FIG. 4 in an enlarged-scale.
Figure 7A:
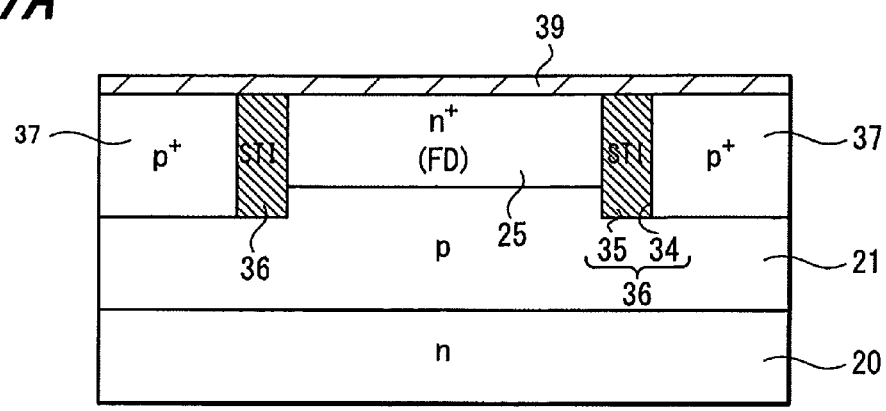
FIG. 7A is a cross-sectional view on the line A-A in FIG. 4.
Figure 7B:
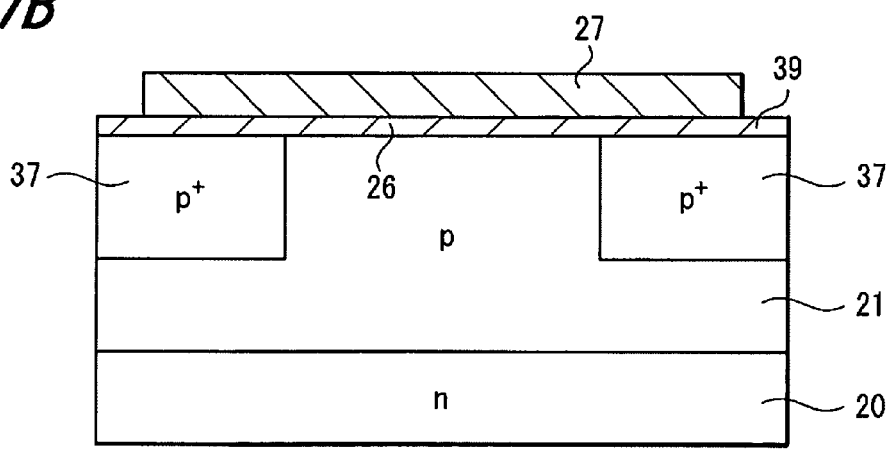
FIG. 7B is a cross-sectional view on the line B-B in FIG. 4.
Figure 7C:
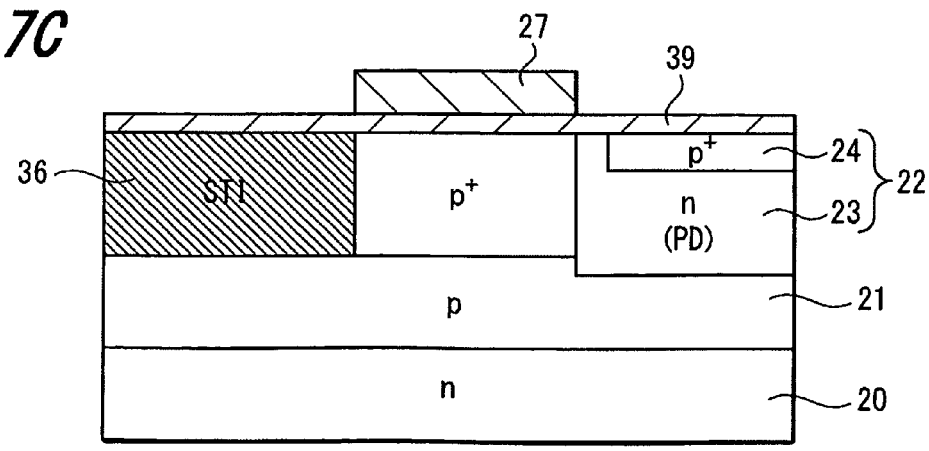
FIG. 7C is a cross-sectional view on the line C-C in FIG. 4.

Then, according to an embodiment of the present invention, in particular, as shown in FIG. 6 (FIG. 6 is an enlarged diagram of main portions in FIG. 4) and FIGS. 7A, 7B and 7C (FIG. 7A is a cross-sectional view on the line A-A in FIG. 6, FIG. 7B is a cross-sectional view on the line B-B in FIG. 6 and FIG. 7C is a cross-sectional view on the line C-C in FIG. 6), an element isolation region bordering the n-type semiconductor region 25 which becomes the floating diffusion (FD) portion is formed as follows. Specifically the n-type semiconductor region 25 is formed by a STI element isolation region (hereinafter referred to as a "shallow trench element isolation region") 36. The shallow trench element isolation region 36 is formed such that a trench 34 formed in the substrate 21 is filled with an insulating film, for example, a silicon oxide film 35, and another element isolation region is formed by a diffusion isolation region formed of an impurity diffusion portion (hereinafter referred to as an "impurity diffusion isolation region") 37. In this example, the impurity diffusion isolation region 37 is formed of a p-type semiconductor region, that is, an opposite conductivity type to those of the diffusion layers 25, 28 and 31 of the respective transistors Tr1 to Tr3.

Also, an insulating film 39 having a film thickness equal to that of the gate-insulated film 26 is formed on the whole surface of the shallow trench element isolation region 36 and the impurity diffusion isolation region 37. The insulating film 39 on the element isolation regions 36 and 37 is substantially formed of the gate-insulated film 26 of the transistor, that is, an extended portion of the gate-insulated film 26. The insulating film other than the insulating film 39 equal to the gate-insulated film is not formed on the element isolation regions 36 and 37. Accordingly, a whole area from the active region of the transistor to the element isolation regions 36 and 37 becomes a planarized surface. Part of the transfer gate electrode 27, the reset gate electrode 29 and the amplification gate electrode 32 of each of the transistors Tr1 to Tr3 is extended from the channel region to the impurity diffusion isolation region 37.

The respective gate electrodes 27, 29 and 32 of the respective transistors Tr1 to Tr3 include first portions corresponding to channel regions 41, 42 and 43 that are active regions and second portions extended from the channel region to the element isolation region (that is, impurity diffusion isolation region) 37, which are made of different materials. While the gate electrodes 27, 29 and 32 are made of polysilicon amorphous silicon, in this example, polysilicon impurities doped into the first portions are made differently from the second portions. FIGS. 8A and 8B to FIGS. 11A and 11B show respective examples. Here, the symbol S denotes a source region, the symbol D denotes a drain region and the reference numeral 37 denotes the diffusion isolation region.

Figure 8A:
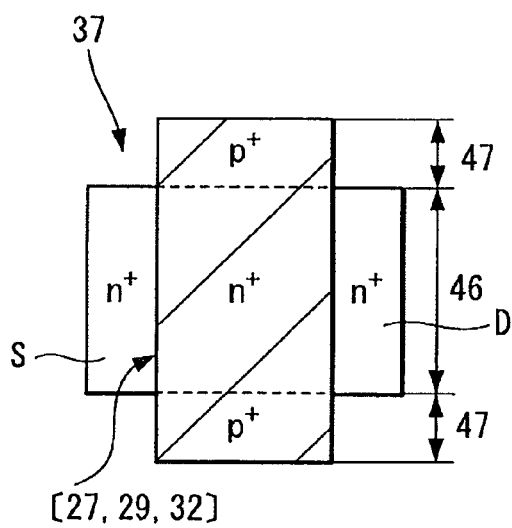
FIGS. 8A and 8B are a plan view and a cross-sectional view respectively showing an example of a gate electrode of a pixel transistor.
Figure 8B:
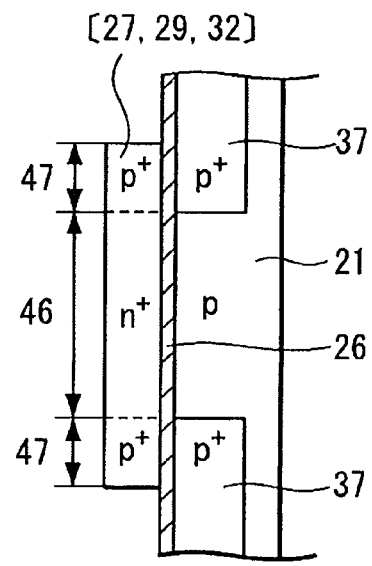

In the examples shown in FIGS. 8A and 8B, a first portion 46 of the gate electrode [27, 29, 32] is formed of n-type impurity doped polysilicon and a second portion 47 is formed of p-type impurity doped polysilicon (first portion/second portion are formed of n-type impurity doped polysilicon/p-type impurity doped polysilicon).

Figure 9A:
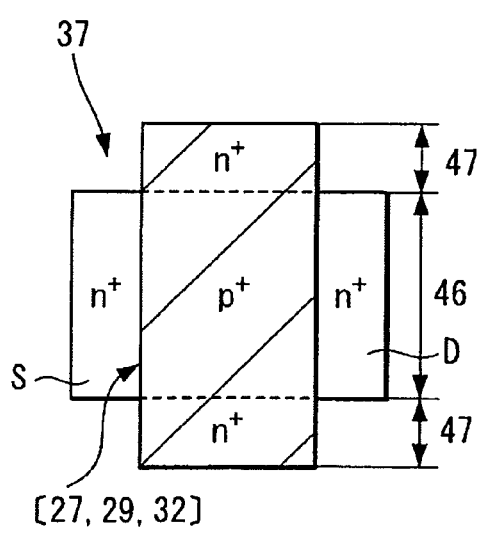
FIGS. 9A and 9B are a plan view and a cross-sectional view respectively showing another example of a gate electrode of a pixel transistor.
Figure 9B:
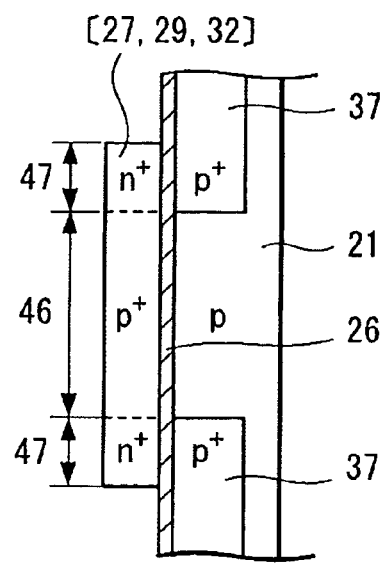

In the examples shown in FIGS. 9A and 9B, the first portion 46 of the gate electrode [27, 29, 32] is formed of p-type impurity doped polysilicon and the second portion 47 is formed of n-type impurity doped polysilicon (first portion/second portion are formed of p-type impurity doped polysilicon/n-type impurity doped polysilicon).

Figure 10A:
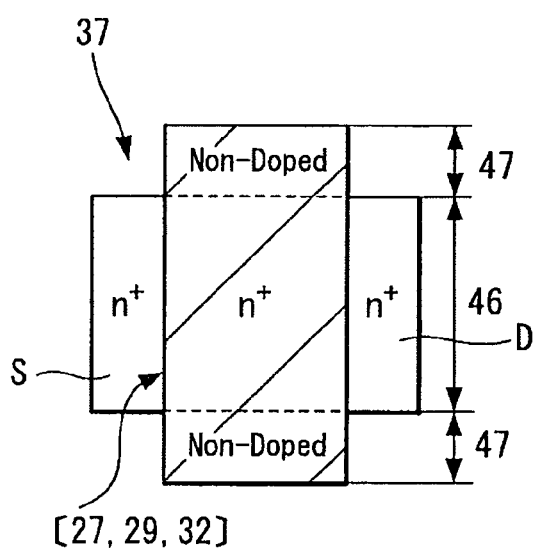
FIGS. 10A and 10B are a plan view and a cross-sectional view respectively showing a further example of a gate electrode of a pixel transistor.
Figure 10B:
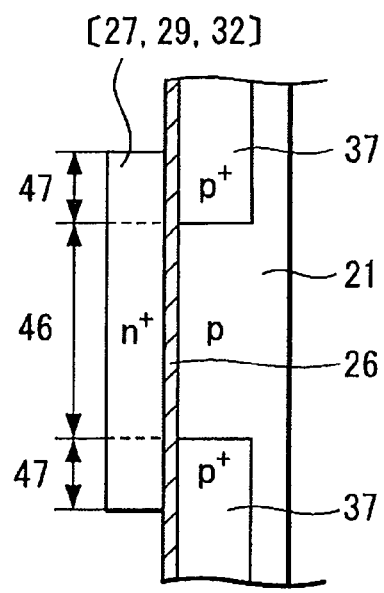

In the examples shown in FIGS. 10A and 10B, the first portion 46 of the gate electrode [27, 29, 32] is formed of n-type impurity doped polysilicon and the second portion 47 is formed of non-doped polysilicon (first portion/second portion are formed of n-type impurity doped polysilicon/non-doped polysilicon).

Figure 11A:
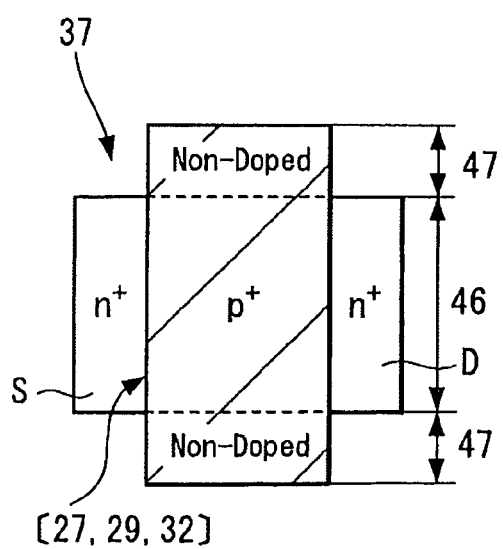
FIGS. 11A and 11B are a plan view and a cross-sectional view respectively showing yet another example of a gate electrode of a pixel transistor.
Figure 11B:
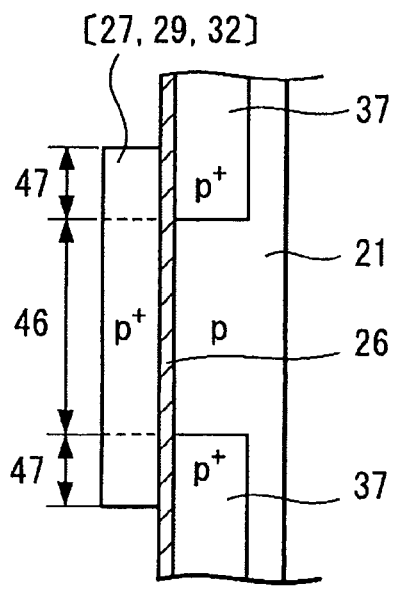

In the examples shown in FIGS. 11A and 11B, the first portion 46 of the gate electrode [27, 29, 32] is formed of p-type impurity doped polysilicon and the second portion 47 is formed of non-doped polysilicon (first portion/second portion are formed of p-type impurity doped polysilicon/non-doped polysilicon).

According to the MOS image sensor of a first embodiment of the present invention, the element isolation region bordering the n-type semiconductor region 25 which becomes the floating diffusion portion is formed by the shallow trench element isolation region 36 in which the insulating film 35 is filled into the trench 34. A capacity formed between the n-type semiconductor region 25 of the floating diffusion portion and the substrate is reduced. As a result, the total capacity $C_{FD}$ of the floating diffusion portion can be reduced and the conversion efficiency when photoelectrically-converted electric charges are converted into a signal voltage can be increased. Accordingly, even when the number of photoelectrically-converted electric charges, that is, the number of electrons, is reduced as the pixel is miniaturized, a high conversion efficiency can be obtained so that the sensitivity of the MOS image sensor can be improved. On the other hand, since the element isolation region at the region other than the region bordering the floating diffusion portion is formed of the p-type impurity diffusion isolation region 37, the occurrence of a dark current and a white spot can be suppressed.

Also, since only the insulating film having the film thickness equal to that of the gate-insulated film, in this example, the same insulating film 39 as the gate-insulated film 26 is formed on the element isolation regions 36 and 37, the gate electrode can be prevented from overlapping the element isolation regions 36 and 37. Thus, even when the pixel is miniaturized increasingly, the structure can be simplified without making the structure on the surface complicated.

Further, if the gate electrodes 27, 29 and 32 of the respective transistors Tr1 to Tr3 have the combined structures in which the first portions 46 corresponding to the channel regions and the second portions 47 corresponding to the impurity diffusion isolation regions 37 are formed of different materials, that is, n-type impurity doped materials, p-type impurity doped materials and non-doped materials, then even when a gate voltage is applied to the first portion, a gate voltage is not applied to the second portion. That is, since a pn-junction is formed at a boundary between the first and second portions 46 and 47, or the second portion 47 is formed of the non-doped material and has a high resistance to act substantially as an insulating material, a gate voltage is not applied to the second portion 47. Accordingly, a parasitic MOS transistor that uses the second portion 47 as a parasitic gate can be prevented from being formed. As a result, it is possible to prevent electric charges from being leaked from the channel region to the channel side (impurity diffusion isolation region 37) and to prevent electric charges from being leaked into the adjacent pixels reliably.

FIG. 12 and FIGS. 13A to 13C show a solid-state imaging device, in this example, a MOS image sensor according to a second embodiment of the present invention, and in particular, a second embodiment of a pixel array portion thereof. FIG. 12 and FIGS. 13A to 13C correspond to FIG. 6 and FIGS. 7A to 7C according to the above-described first embodiment of the present invention, respectively. The rest of arrangement is similar to those shown in FIGS. 4 and 5. In FIG. 12 and FIGS. 13A to 13C, elements and parts identical to those of FIG. 6 and FIGS. 7A to 7C are denoted by identical reference numerals.

Also, in the second embodiment of the present invention, similarly to the above description made with reference to FIGS. 4 and 5, the solid-state imaging device includes an array of a plurality of unit pixels 11 including the photodiode 22 which is the photoelectric conversion element and the three pixel transistors, that is, the read transistor (hereinafter referred to as a "transfer transistor") Tr1, the reset transistor Tr2 and the amplification transistor Tr3. In this embodiment, each of the transistors Tr1 to Tr3 is composed of a n-channel MOS transistor.

Also, as similarly shown in FIGS. 4 and 5, the first conductivity-type semiconductor substrate, that is, the n-type silicon substrate 20 is provided with the second conductivity-type, for example, the p-type semiconductor well region 21 formed thereon. The photodiode 22 is formed in the p-type semiconductor well region 21 and includes the n-type semiconductor region (diffusion layer) 23 which becomes the charge accumulation region and the p-type accumulation layer 24 to suppress a dark current on the surface of the n-type semiconductor region (diffusion layer) 23.

The transfer transistor Tr1 includes the photodiode 22 as the source thereof, the n-type semiconductor region (diffusion layer) 25, which becomes the floating diffusion (FD) portion formed in the p-type semiconductor well region 21, as the drain thereof and the transfer gate electrode 27 formed through the gate-insulated film 26.

The reset transistor Tr2 includes the n-type semiconductor region 25, which becomes the floating diffusion (FD) portion, as the source thereof, the n-type semiconductor region (diffusion layer) 28 formed in the p-type semiconductor well region 21 as the drain thereof and the reset gate electrode 29 formed through the gate-insulated film 26.

The amplification transistor Tr3 includes the n-type semiconductor regions (diffusion layers) 31 and 28 formed in the p-type semiconductor well region 21 as the source and drain thereof and the amplification gate electrode 32 formed through the gate-insulated film 26.

Figure 12:
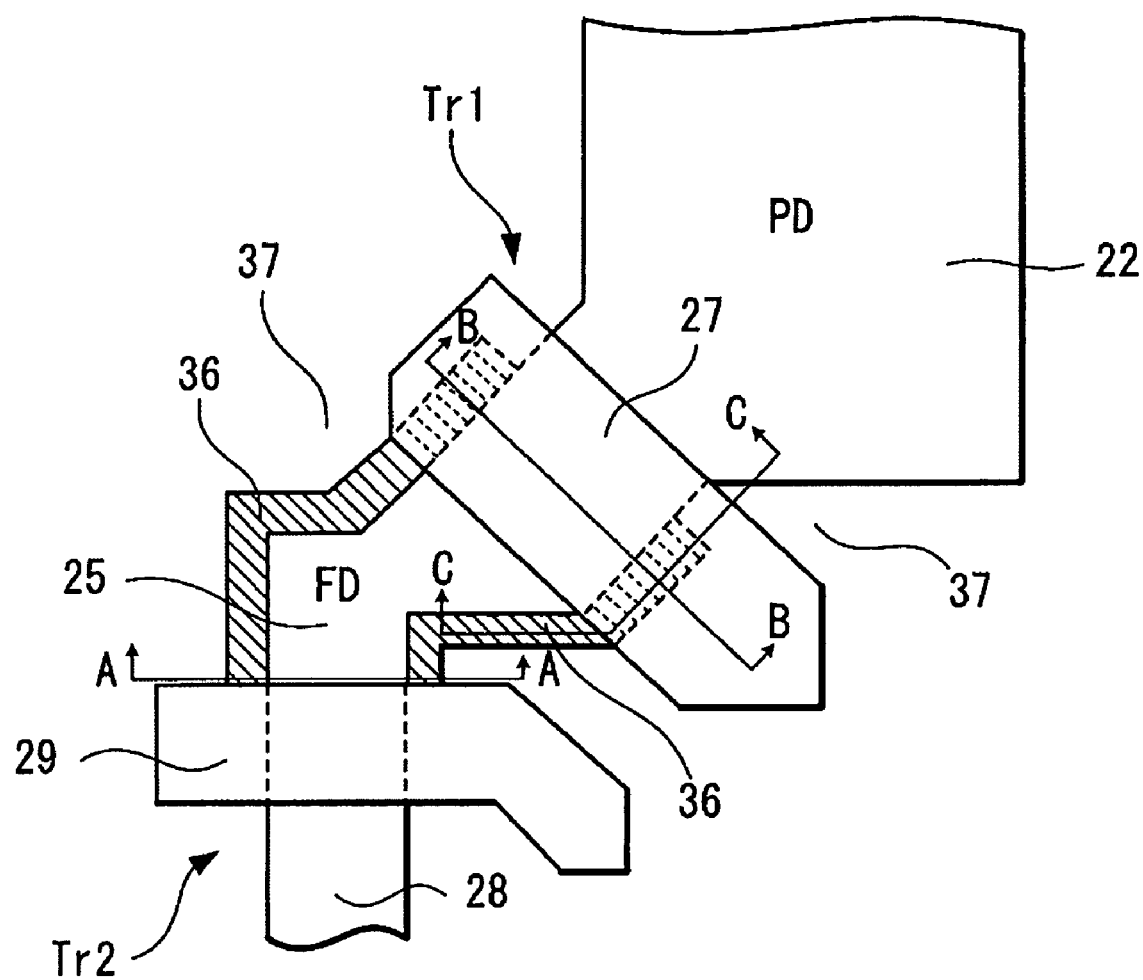
FIG. 12 is a diagram showing a solid-state imaging device according to a second embodiment of the present invention, and in particular, showing main portions of a pixel array portion thereof.
Figure 13A:
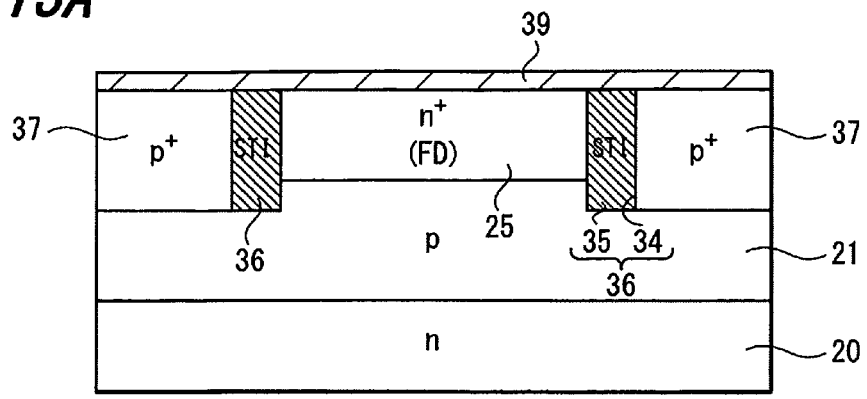
FIG. 13A is a cross-sectional view on the line A-A in FIG. 12.
Figure 13B:
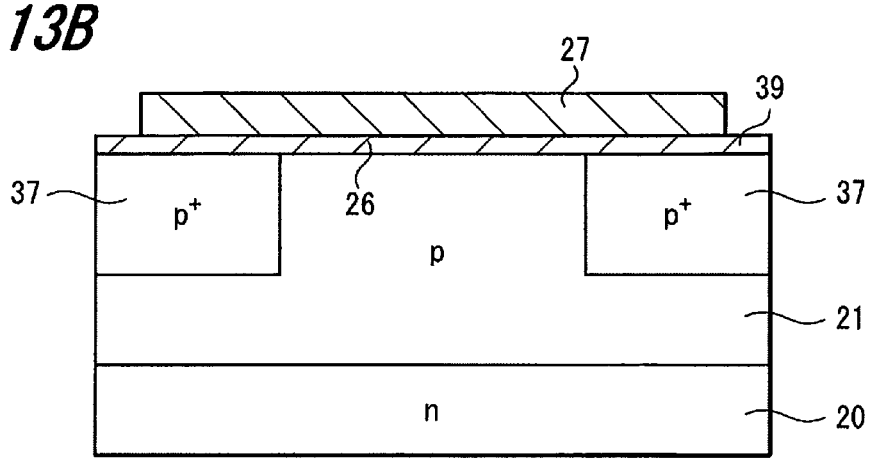
FIG. 13B is a cross-sectional view on the line B-B in FIG. 12.
Figure 13C:
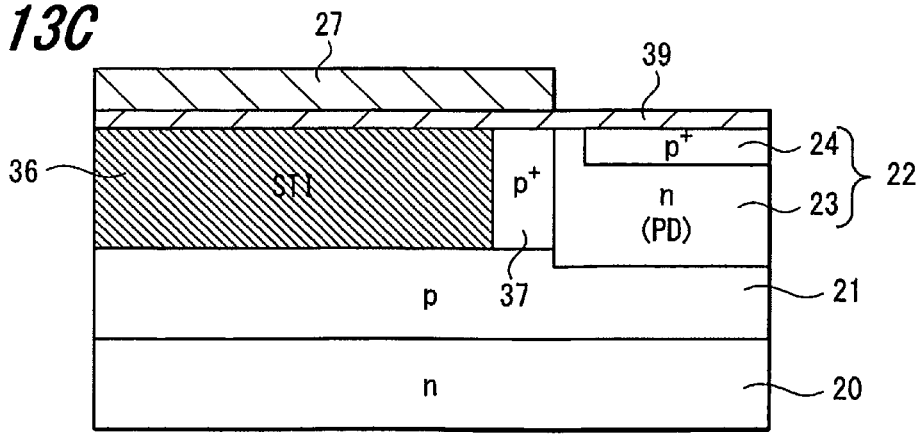
FIG. 13C is a cross-sectional view on the line C-C in FIG. 12.

Then, according to the second embodiment of the present invention, in particular, as shown in FIG. 12 and FIGS. 13A to 13C (FIG. 13A is a cross-sectional view on the line A-A in FIG. 12, FIG. 13B is a cross-sectional view on the line B-B in FIG. 12 and FIG. 13C is a cross-sectional view on the line C-C in FIG. 12), the element isolation region is formed as follows. Accordingly, the element isolation region extends from the region bordering the n-type semiconductor region 25 which becomes the floating diffusion (FD) portion along the transfer channel region to the region extending to a portion under the transfer gate electrode. The element isolation region is formed by a shallow trench element isolation region 36 in which the trench 34 formed in the substrate 21 is filled with the insulating film, for example, the silicon oxide film 35. The other element isolation region is formed of the impurity diffusion isolation region 37 made of an impurity diffusion portion. In this example, the impurity diffusion isolation region 37 is formed of a p-type semiconductor region, that is, a conductivity type, opposite to those of the diffusion layers 25, 28 and 31 of the respective transistors Tr1 to Tr3.

An end portion of the shallow trench element isolation region 36 extended under the transfer gate electrode is not in contact with the n-type semiconductor region 23 which is the charge accumulation region of the photodiode, and instead, the impurity diffusion isolation region 37 is provided between the end of the extended portion of the shallow trench element isolation region 36 and the photodiode 22.

Also, as shown in FIGS. 13A to 13C, an insulating film 39 having a film thickness equal to that of the gate-insulated film 26 is formed on the whole surface of the shallow trench element isolation region 36 and the impurity diffusion isolation region 37. The insulating film 39 on the element isolation regions 36 and 37 is substantially formed of the gate-insulated film 26 of the transistor, that is, the extended portion of the gate-insulated film 26. The insulating film other than the insulating film 39 equal to the gate-insulated film 26 is not formed on the element isolation regions 36 and 37. Accordingly, the whole area from the active region of the transistor to the element isolation regions 36 and 37 is thoroughly formed as a planarized surface. A part of the transfer gate electrode 27, the reset gate electrode 29 and the amplification gate electrode 32 of the respective transistors Tr1 to Tr3 is extended from the channel region to the impurity diffusion isolation region 37.

According to the second embodiment of the present invention, in the respective gate electrodes 27, 29 and 32 of the respective transistors Tr1 to Tr3, the first portions corresponding to channel regions 41, 42 and 43 which are active regions and the second portions extended from the channel region to the impurity diffusion isolation region 37 can be made of different materials similarly to the above-described respective examples shown in FIG. 8 to FIGS. 11A to 11C.

According to the MOS image sensor of the second embodiment of the present invention, the element isolation region bordering the n-type semiconductor region 25 which is the floating diffusion portion is formed by the shallow trench element isolation region 36 in which the insulating film 35 is filled into the trench 34. As a result, the total capacity $C_{FD}$ of the floating diffusion portion can be reduced and the conversion efficiency when photoelectrically-converted electric charges are converted into a signal voltage can be increased. Accordingly, even when the number of photoelectrically-converted electric charges, that is, the number of electrons, is reduced as the pixel is miniaturized, a high conversion efficiency can be obtained so that the sensitivity of the MOS image sensor can be improved.

Further, since a part of the shallow trench element isolation region 36 is extended under the transfer gate electrode 27, electric charges can be read readily from the photodiode 22 to the floating diffusion portion 25. That is, if the element isolation region at the side of the transfer channel is formed of the p-type impurity diffusion isolation region 37, p-type impurities may be diffused readily in the annealing process of the manufacturing process from the impurity diffusion isolation region to the portion under the transfer gate electrode, that is, the transfer channel region. When the p-type impurities are diffused into the transfer channel region, a threshold voltage Vt of the transfer transistor Tr1 is increased effectively, which may cause difficulty in reading electric charges. However, according to the second embodiment of the present invention, the shallow trench element isolation region 36 can prevent p-type impurities from being diffused from the impurity diffusion isolation region to the transfer channel region in the annealing process, so that the threshold voltage Vt can be prevented from being raised.

Also, since a part of the shallow trench element isolation region 36 is formed extending under the transfer gate electrode 27, it is possible to prevent electric charges from being leaked from the transfer channel region to the impurity diffusion isolation region 37 at the side of the channel.

On the other hand, since the element isolation region in the region other than the region extended from the portion bordering the floating diffusion portion to a portion under the part the transfer gate electrode is formed of the p-type impurity diffusion isolation region 37, it is possible to suppress the occurrence of a dark current and a white spot.

Further, when the first portion 46 in which the gate electrodes 27, 29 and 32 of the respective transistors Tr1 to Tr3 correspond to the channel regions and the second portion 47 corresponding to the impurity diffusion isolation region 37 are formed of different materials as mentioned above, it is possible to prevent the parasitic MOS transistor having the second portion 47 as the parasitic gate from being formed. Also, it is possible to reliably prevent electric charges from being leaked from the channel region to the channel side (impurity diffusion isolation region 37), or it is possible to reliably prevent electric charges from being leaked to the adjacent pixels.

According to the first and second embodiments of the present invention, the whole surface of the shallow trench element isolation region 36 and the impurity diffusion isolation region 37 is planarized by forming the insulating film 39 having the film thickness equal to that of the gate-insulated film 26. However, an embodiment of the present invention is not limited thereto and, as shown in a third embodiment of the present invention shown in FIG. 14, an insulating film 48 thicker than the gate-insulated film 26, for example, a silicon oxide film, can be formed on the impurity diffusion isolation region 37. The rest of arrangement is similar to that of the first embodiment of the present invention or that of the second embodiment of the present invention.

In the case of the above-described arrangement, differently from the arrangement shown in FIGS. 8A and 8B to FIGS. 11A and 11B, the first portion corresponding to the active region and the second portion corresponding to the element isolation region may be made of the same material. Since the insulating film 48 having the large thickness is formed on the impurity diffusion isolation region 37, even when the gate electrode overlaps the thick insulating film 48, it is possible to prevent a parasitic MOS transistor from being formed.

Figure 14:
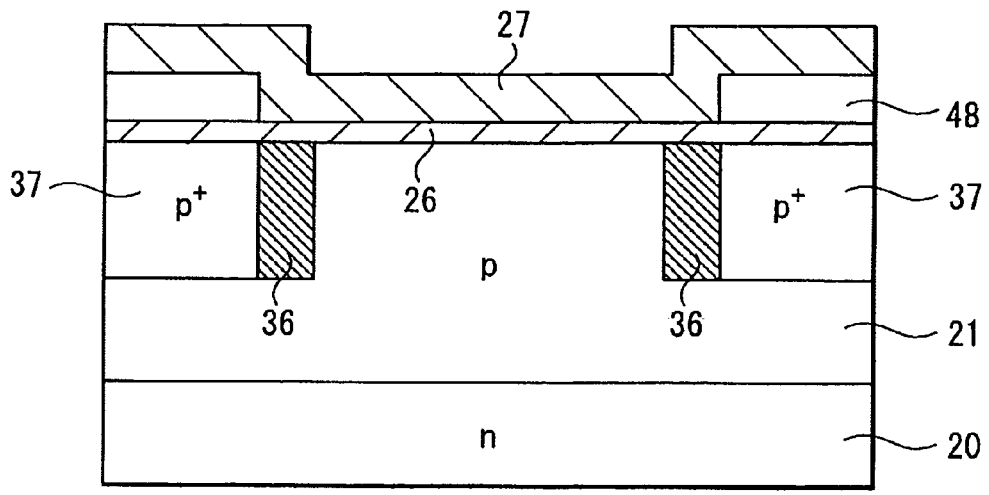
FIG. 14 is a cross-sectional view showing a solid-state imaging device according to a third embodiment of the present invention, and in particular, showing main portions of a pixel array portion thereof.

Also, according to the third embodiment of the present invention shown in FIG. 14, the element isolation region bordering at least the floating diffusion portion is formed of the shallow trench element isolation region 36. Accordingly, the conversion efficiency can be enhanced, and the sensitivity can be increased even when the pixel is miniaturized. Further, since the other element isolation region is formed of the impurity diffusion isolation region 37, it is possible to suppress the occurrence of a dark current and a white spot.

Embodiments of the present invention are suitable for application to a MOS image sensor having an arrangement in which pixel transistors other than the transfer transistor is shared with a plurality of pixels (for example, two pixels, four pixels, etc.). This arrangement hereinafter will be referred to as a "pixel sharing arrangement". According to the pixel sharing MOS image sensor, electric charges from two photodiodes are alternately read at one floating diffusion portion depending on the layout. For example, when a solid-state imaging device is of a four-pixel sharing, two floating diffusion portions are formed and the two floating diffusion portions are electrically connected by wiring. For this reason, a total capacity of the floating diffusion portions may be increased. Therefore, if the element isolation region in which the shallow trench element isolation region and the impurity diffusion isolation region are combined is applied to the solid-state imaging device as an element isolation region, then it is possible to improve conversion efficiency by reducing the total capacity of the floating diffusion portions.

Figure 15:
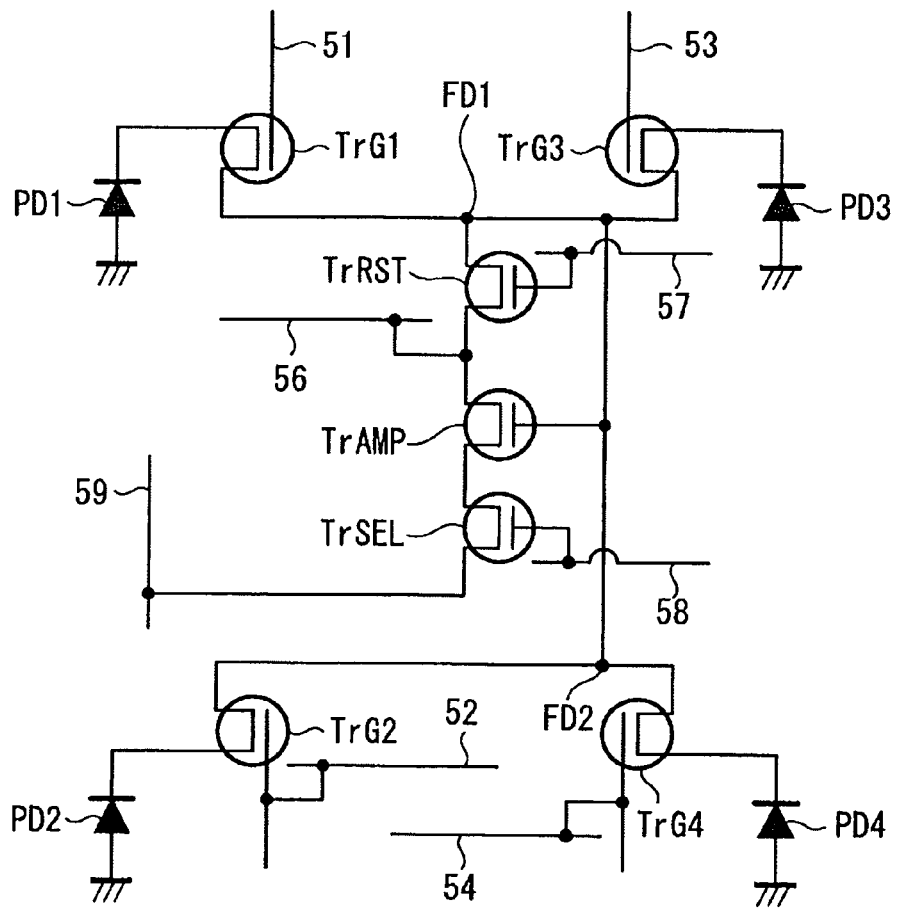
FIG. 15 is a circuit diagram showing an example of a pixel sharing circuit arrangement to which an embodiment of the present invention is applied.

FIG. 15 shows an example of an equivalent circuit of a MOS image sensor in which pixel transistors are shared with four pixels. As shown in FIG. 15, an equivalent circuit according to this embodiment includes four photodiodes PD1, PD2, PD3, PD4, four transfer transistors TrG1, TrG2, TrG3, TrG4, two floating diffusion portions FD1, FD2, a shared reset transistor TrRST, an amplification transistor TrAMP and a selection transistor TrSEL.

The first and third photodiodes PD1 and PD3 are connected through the transfer transistors TrG1 and TrG3 to the first floating diffusion portion FD1. Also, the second and fourth photodiodes PD2 and PD4 are connected through the transfer transistors TrG2 and TrG4 to the second floating diffusion portion FD2. Transfer wirings 51, 52, 53 and 54 for supplying transfer pulses are respectively connected to the gates of the first to fourth transfer transistors TrG1 to TrG4.

The first and second floating diffusion portions FD1 and FD2 are connected in common to the gate of the amplification transistor TrAMP and to the source of the reset transistor TrRST. A power supply wiring (VDD) 56 is connected to the drain of the reset transistor TrRST and the drain of the amplification transistor TrAMP. A reset wiring 57 for supplying a reset pulse is connected to the gate of the reset transistor TrRST.

The source of the amplification transistor TrAMP is connected to the drain of the selection transistor TrSEL, the source of the selection transistor TrSEL is connected to a vertical signal line 59 and the gate of the selection transistor TrSEL is connected to a selection wiring 58 for supplying a selection pulse.

In the above-described circuit arrangement, electric charges photoelectrically-converted at the respective photodiodes PD1 to PD4 are sequentially read to the corresponding first and second floating diffusion portions FD1 and FD2 with a time difference, converted into a pixel signal at the amplification transistor TrAMP and outputted to the vertical signal line 59. The electric charges read to the first and second floating diffusion portions FD1 and FD2 are converted into the pixel signal and reset through the reset transistor TrRST.

According to a fourth embodiment of the present invention, the MOS image sensor includes the pixel array portion in which the equivalent circuit of the four-pixel sharing structure shown in FIG. 14 is arrayed. The element isolation regions bordering the first and second floating diffusion portions FD1 and FD2 are formed of the shallow trench element isolation regions, and the other element isolation regions are formed of the impurity diffusion isolation regions, thereby obtaining an element isolation structure similar to those of the above-described first and second embodiments of the present invention.

According to the fourth embodiment of the present invention, since the first and second floating diffusion portions FD1 and FD2 are electrically connected in the four-pixel sharing arrangement, the capacity at the floating diffusion portions FD1 and FD2 increases. However, since the element isolation regions bordering the floating diffusion portions FD1 and FD2 are formed of the shallow trench element isolation regions, the capacity at the floating diffusion portion can be reduced, and hence the conversion efficiency can be improved. Accordingly, based on a combination of the shallow trench element isolation region and the impurity diffusion isolation region, it is possible to increase the sensitivity by improving the conversion efficiency while suppressing the occurrence of a dark current and a white spot.

According to the MOS image sensor, the reset transistor constituting the pixel may be formed with a distance from the floating diffusion portion. In this arrangement, a diffusion layer that is to be the floating diffusion portion and the source region of the reset transistor are connected by wiring. If an embodiment of the present invention is applied to the arrangement, as shown in the first and second embodiments of the present invention, the element isolation region of the region at least bordering the floating diffusion portion is formed of the shallow trench element isolation region. In addition, the element isolation region bordering the circumference of the source region (diffusion layer) of the independently formed reset transistor also is formed of the shallow trench element isolation region. The other element isolation regions are formed of the impurity diffusion isolation regions.

According to the above-mentioned fifth embodiment of the present invention, the sensitivity can be improved by increasing the conversion efficiency while suppressing the occurrence of a dark current and a white spot.

While the n-channel MOS transistor is applied as respective pixel transistors to the solid-state imaging device according to the above-described embodiments, the present invention is not limited thereto, and a p-channel MOS transistor can be applied to the solid-state imaging device as a pixel transistor. In the case of the n-channel MOS transistor, the n-type is set to the first conductivity type and the p-type is set to the second conductivity type in the above-mentioned embodiments. In the case of the p-channel MOS transistor, the p-type is set to the first conductivity type and the n-type is set to the second conductivity type. That is, the n-channel and the p-channel have opposite conductivity types.

Also, the above-described embodiments of the present invention are applied, for example, to the area sensor in which pixels are arrayed in a two-dimensional matrix. The present invention is not limited to the application to the area sensor and can be applied to a linear sensor (line sensor) in which the above-described pixels are linearly arrayed one-dimensionally.

Figure 16:
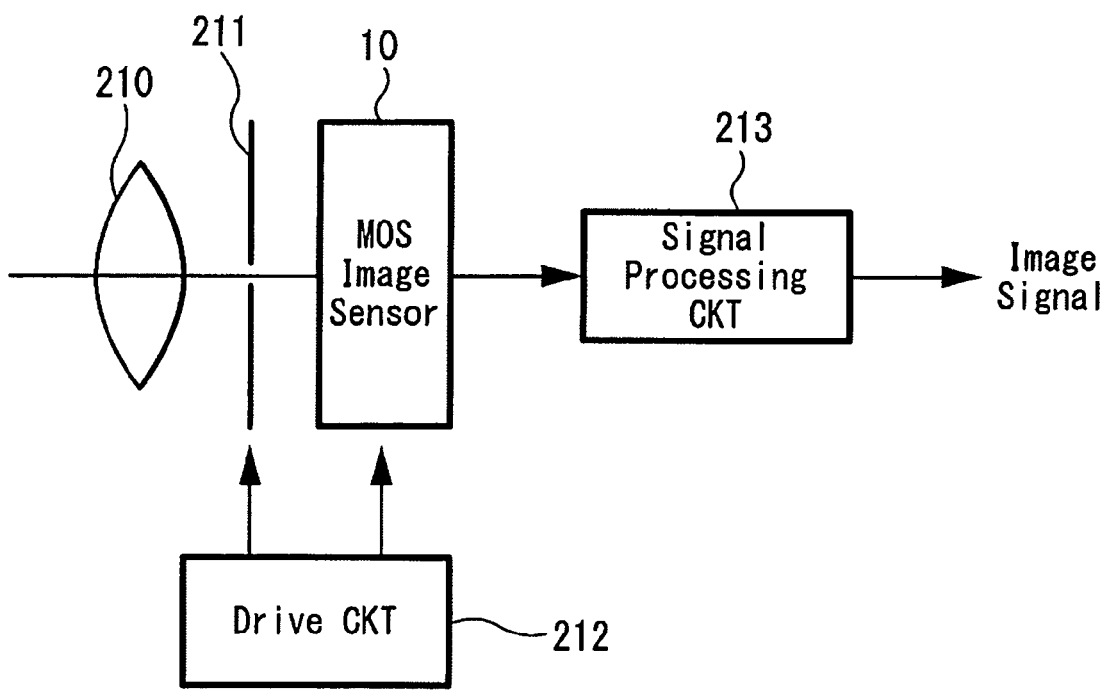
FIG. 16 is a schematic diagram showing a configuration of a camera according to an embodiment of the present invention.

FIG. 16 is a schematic cross-sectional view showing a camera according to an embodiment of the present invention. The camera according to the embodiment of the present invention is a video camera capable of capturing still images or moving images, for example.

As shown in FIG. 16, the camera according to the embodiment of the present invention includes a MOS image sensor 10, an optical system 210, a shutter device 211, a drive circuit 212 and a signal processing circuit 213.

The optical system 210 focuses image light (incident light) reflected from an object on an imaging screen of the MOS image sensor 10. As a result, signal electric charges are accumulated in the MOS image sensor 10 for a specific period.

The shutter device 211 is configured to control a light irradiation period and a light shaded period for the MOS image sensor 10.

The drive circuit 212 is configured to supply drive signals to control transfer operations of the MOS image sensor 10 and shutter operations of the shutter device 211. The MOS image sensor is configured to transfer signals upon receiving a drive signal (timing signal) supplied from the drive circuit 212. The signal processing circuit 213 is configured to carry out various kinds of signal processing. An image signal obtained after signal processing is stored in a storage medium, such as a memory, or outputted to a monitor.

The above-described solid-state imaging device according to the embodiments of the present invention, specifically, the MOS image sensor, is suitable for the application to a solid-state imaging device mounted on mobile devices, such as a mobile phone unit with a camera and a PDA.

In particular, according to the embodiments of the present invention, the conversion efficiency can be improved while suppressing the occurrence of a dark current and a white spot, if the area of the photodiode, which is the photoelectric conversion element, is miniaturized along with the pixel size being reduced as the number of pixels is increased.

It should be understood by those skilled in the art that various modifications, combinations, subcombinations and alterations may occur depending on design requirements and other factors insofar as they are within the scope of the appended claims or the equivalents thereof.

What is claimed is:

1. A pixel device comprising:
    a floating diffusion portion formed between a first shallow trench isolation region and a second shallow trench isolation region, the first and second shallow trench isolation regions being in bordering contact with the floating diffusion portion;
    a transfer transistor configured to transfer electric charges photoelectrically-converted in a photoelectric conversion element to the floating diffusion portion; and
    a first impurity diffusion isolation region formed on a side of the first shallow trench isolation region opposite from the floating diffusion portion, the first impurity diffusion isolation region being in bordering contact with the first shallow trench isolation region and having a conductivity type opposite to a conductivity type of the floating diffusion portion, wherein
    the first and second shallow trench isolation regions extend under a gate electrode of the transfer transistor,
    a portion of the first impurity diffusion isolation region is interposed between a distal end portion of the first shallow trench isolation region and the photoelectric conversion element,
    the portion of the first impurity diffusion isolation region interposed between the distal end portion of the first shallow trench isolation region and the photoelectric conversion element is in bordering contact with a surface of the distal end portion of the first shallow trench isolation region at an interface,
    the interface abuts a channel region between the photoelectric conversion element and the floating diffusion portion at a position under the gate electrode of the transfer transistor and the portion of the first impurity diffusion region interposed between the distal end portion of the first shallow trench isolation region and the photoelectric conversion element comes in bordering contact with the channel region.

2. A pixel device according to claim 1, wherein the portion of the first impurity diffusion isolation region that is interposed between the distal end portion of the first shallow trench isolation region and the photoelectric conversion element is at least partially in a region under the gate electrode of the transfer transistor.

3. The pixel device according to claim 1, wherein a planarized insulating film is formed on the first and second shallow trench isolation regions, the planarized insulating film having a thickness equal to a thickness of a gate-insulated film included in the transfer transistor.

4. An imaging device including a plurality of pixel devices according to claim 1, wherein the pixels devices formed in an array.

5. The imaging device according to claim 4, wherein the plurality of pixel devices share pixel transistors other than the transfer transistor.

6. A camera including the pixel device according to claim 1.

7. A pixel device according to claim 1, further comprising:
    a reset transistor configured to reset an electric potential of the floating diffusion portion.

8. A pixel device according to claim 7, wherein the floating diffusion portion is separated from a source of the reset transistor.

9. The pixel device according to claim 8, wherein a third shallow trench isolation region is formed around the perimeter of the source of the reset transistor.

10. The pixel device according to claim 9, wherein the floating diffusion portion and source of the reset transistor are electrically connected by wiring.

11. The pixel device according to claim 9, wherein the first and second shallow trench isolation regions extend from the reset transistor to the transfer transistor.

12. The pixel device according to claim 1, further comprising:
    a second impurity diffusion isolation region formed on a side of the second shallow trench isolation region opposite from the floating diffusion portion, the second impurity diffusion isolation region being in bordering contact with the second shallow trench isolation region and having a conductivity type opposite to a conductivity type of the floating diffusion portion.

13. The pixel device according to claim 12, wherein a portion of the second impurity diffusion isolation region is interposed between a distal end portion of the second shallow trench isolation region and the photoelectric conversion element.

14. The pixel device according to claim 1, wherein an insulating layer is formed on the first and second impurity diffusion isolation regions, the insulating layer having a thickness greater than a thickness of a gate-insulated film included in the transfer transistor.

15. The pixel device according to claim 1, wherein an edge surface of the portion of the first impurity diffusion isolation region interposed between the distal end portion of the first shallow trench isolation region and the photoelectric conversion element is in bordering contact with a portion of the photoelectric conversion element.

16. The pixel device according to claim 15, wherein the portion of the first impurity diffusion isolation region interposed between the distal end portion of the first shallow trench isolation region and the photoelectric conversion element is at least partially in a region under the gate electrode of the transfer transistor.

17. The pixel device according to claim 16, wherein a planarized insulating film is formed on the first and second shallow trench isolation regions, the planarized insulating film having a thickness equal to a thickness of a gate-insulated film included in the transfer transistor.

18. An imaging device including a plurality of pixel devices according to claim 16, wherein the pixels devices formed in an array, and the plurality of pixel devices share pixel transistors other than the transfer transistor.

19. A camera including the pixel device according to claim 16.

* * * * *